United States Patent
Moody et al.

(10) Patent No.: US 10,120,017 B2
(45) Date of Patent: Nov. 6, 2018

(54) ENABLING TESTING OF AN INTEGRATED CIRCUIT AT A SINGLE TEMPERATURE

(71) Applicant: Allegro MicroSystems, LLC, Manchester, NH (US)

(72) Inventors: Kristann L. Moody, Strafford, NH (US); Alejandro G. Milesi, Buenos Aires (AR); Sam Tran, Lee, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 236 days.

(21) Appl. No.: 15/211,022

(22) Filed: Jul. 15, 2016

(65) Prior Publication Data

US 2018/0017615 A1    Jan. 18, 2018

(51) Int. Cl.
*G01J 5/16* (2006.01)
*G01R 31/28* (2006.01)

(52) U.S. Cl.
CPC ................ *G01R 31/2874* (2013.01)

(58) Field of Classification Search
CPC ............................ G01R 31/2874; G01R 31/44
USPC ....................... 324/750.03, 207.25, 202, 225
See application file for complete search history.

(56) References Cited

U.S. PATENT DOCUMENTS

| 8,269,491 | B2 | 9/2012 | Cummings et al. |
| 8,350,563 | B2 * | 1/2013 | Haas ................ G01R 33/0029 324/225 |
| 8,736,260 | B2 | 5/2014 | Foletto et al. |
| 9,046,562 | B2 | 6/2015 | Cummings et al. |
| 9,052,349 | B2 | 6/2015 | Haas et al. |
| 9,395,391 | B2 | 7/2016 | Fernandez et al. |
| 2014/0222364 | A1 | 8/2014 | Foletto et al. |
| 2016/0231393 | A1 | 8/2016 | Fernandez et al. |

* cited by examiner

*Primary Examiner* — Farhana Hoque
(74) *Attorney, Agent, or Firm* — Daly, Crowley, Mofford & Durkee, LLP

(57) ABSTRACT

In one aspect, an integrated circuit (IC) includes an output port enabling measurement of a performance characteristic of the IC at a first temperature. The performance characteristic of the IC is a minimum value at the first temperature with respect to any other temperature. The first temperature may be room temperature.

17 Claims, 7 Drawing Sheets

ENABLING TESTING OF AN INTEGRATED CIRCUIT AT A SINGLE TEMPERATURE

BACKGROUND

Integrated circuits (IC) are generally tested after being fabricated. For example, a probe is used to test electrical characteristics at several temperatures in a temperature range that the IC is designed to operate to ensure that the IC can operate over the temperature range.

SUMMARY

In one aspect, an integrated circuit (IC) includes an output port enabling measurement of a performance characteristic of the IC at a first temperature. The performance characteristic of the IC is a minimum value at the first temperature with respect to any other temperature.

In another aspect, an integrated circuit (IC), includes a first digital-to-analog converter (DAC) configured to receive a first current that is independent of temperature, a second DAC configured to receive a second current proportional to temperature, a third DAC configured to receive a third current that increases in magnitude above room temperature and is zero below the room temperature, a fourth DAC to receive the output of the first, second and third DACs to produce an output current and an output port enabling measurement of a performance characteristic of the IC at the room temperature. The performance characteristic of the IC is a minimum value at the room temperature with respect to any other temperature. The performance characteristic is controlled by at least one of current, voltage or a magnetic field. The output current is weighted to enable the output current to have the minimum value at the first temperature.

DESCRIPTION OF THE DRAWINGS

The foregoing features of the invention, as well as the invention itself may be more fully understood from the following detailed description of the drawings, in which.

DETAIL DESCRIPTION

Described herein are techniques to force a minimum performance characteristic to occur at a desired temperature (DT). In one particular example, the DT is at room temperature. Other techniques describe trimming the minimum performance characteristic to be at the DT if the minimum performance characteristic does not occur after manufacturing the IC. While the examples described herein use a performance characteristic controlled by current other performance characteristics may be controlled by other parameters such as, for example, voltage or a magnetic field.

Using the techniques described herein a minimum performance characteristic may occur at room temperature so that, for example, an IC may only need to be tested at room temperature while having confidence that the IC will perform better at colder or hotter temperatures. Thus, time and money for testing is saved.

Figure 1:
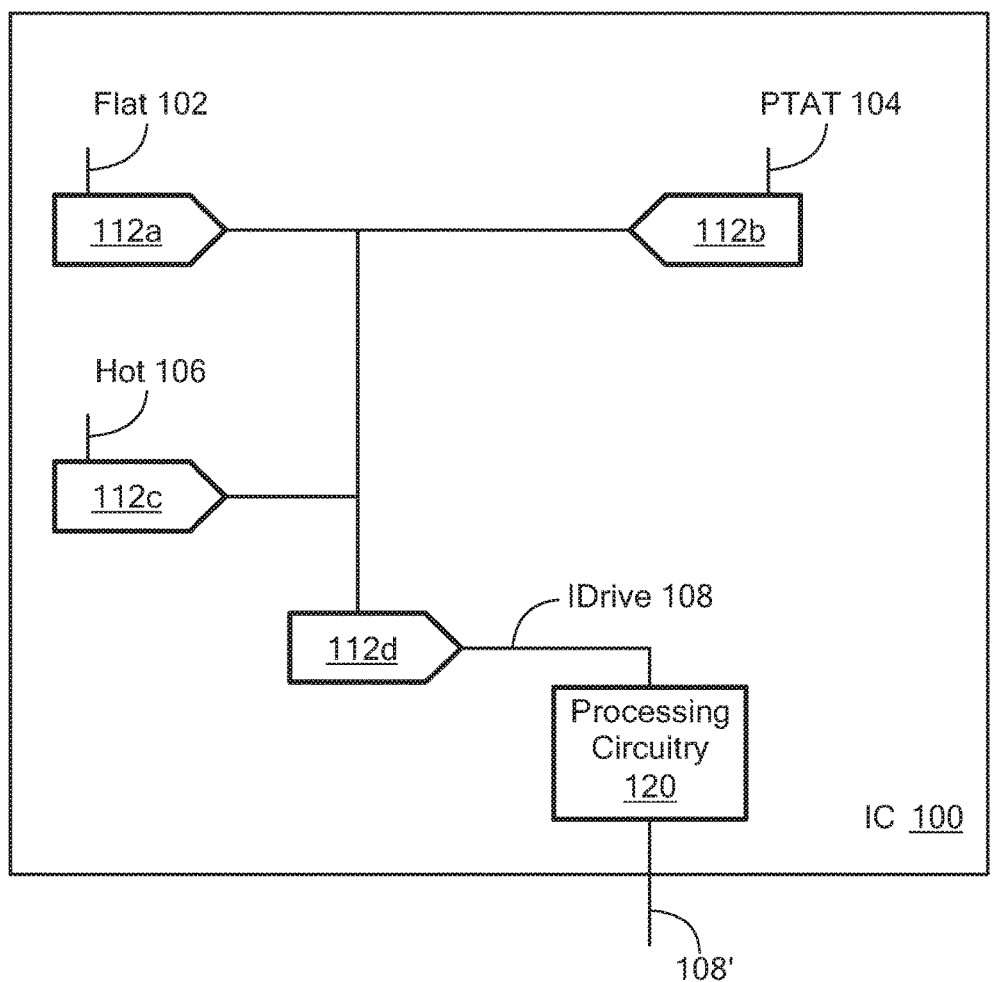
FIG. 1 is a schematic diagram of an example of a circuit to enable testing of an integrated circuit (IC) at a single temperature.

Referring to FIG. 1, in one example, an IC 100 includes a digital-to-analog converters (DAC) (e.g., a DAC 112a, a DAC 112b, a DAC 112c and DAC 112d) and processing circuitry 120. The DAC 112a receives a current 102 (also called herein flat current 102), which is independent of temperature. The DAC 112b receives a current 104 (also called herein PTAT current 104), which is proportional to temperature (PTAT). In one particular example, the flat current 102 and the PTAT current 104 are selected to be equal at DT. The DAC 112c receives a current 106 (also called herein a hot current 106), which increases in current with increasing temperature from the DT and is zero at DT and below.

The DAC 112d combines the flat current 102, the PTAT current 104 and the hot current 106 to form a current 108 (also called an IDrive current 108). The current 108 is further weighted using processing circuitry 120 to form a current 108' (as further described in FIGS. 3A and 3B).

Figure 2A:
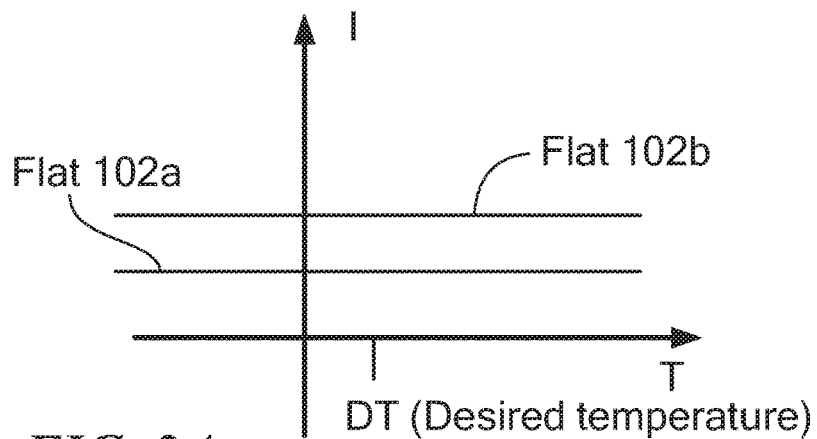
FIG. 2A is a graph depicting examples of current characteristics independent of temperature.
Figure 2B:
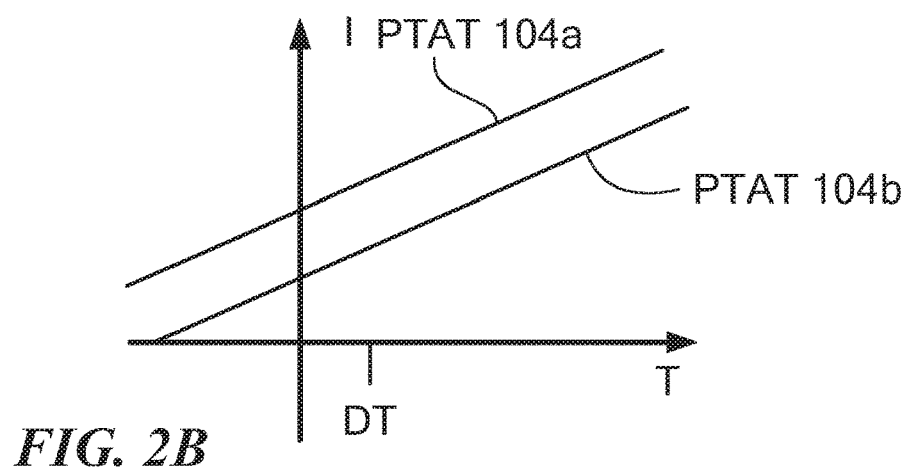
FIG. 2B is a graph depicting examples of current characteristics proportional to temperature.

Referring to FIGS. 2A and 2B, in one example, the flat current 102 may be selected from one of plurality of flat currents (e.g., a flat current 102a and a flat current 102b) that are independent of temperature and the PTAT current 104 may be selected from one of a plurality of PTAT currents (e.g., a PTAT current 104a and a PTAT current 104b) having the same slope, for example, so that PTAT current 104 equals flat current 102 at DT.

Figure 2C:
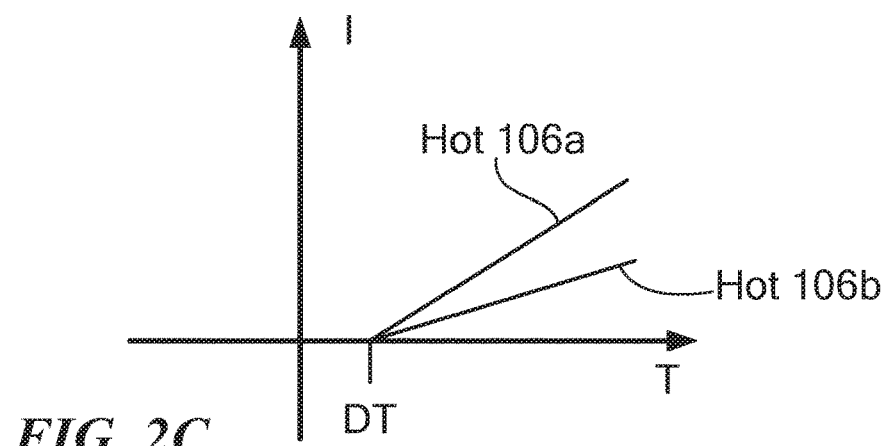
FIG. 2C is a graph depicting examples of current characteristics that increase above a desired temperature (DT)

Referring to FIG. 2C, the hot current 106 may be selected from one of a plurality of hot currents (e.g., a hot current 106a and a hot current 106b) that may have different slopes but have zero current at DT and below.

Figure 3A:
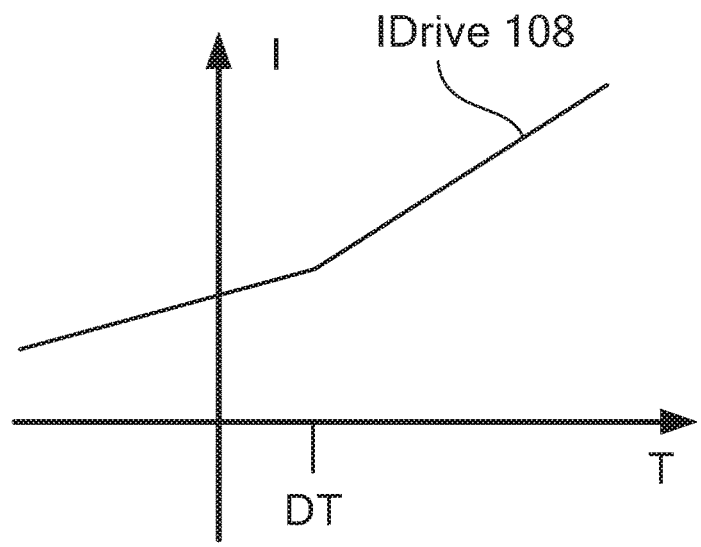
FIG. 3A is a graph depicting an example of adding a current of FIG. 2A, a current of FIG. 2B and a current of FIG. 2C.
Figure 3B:
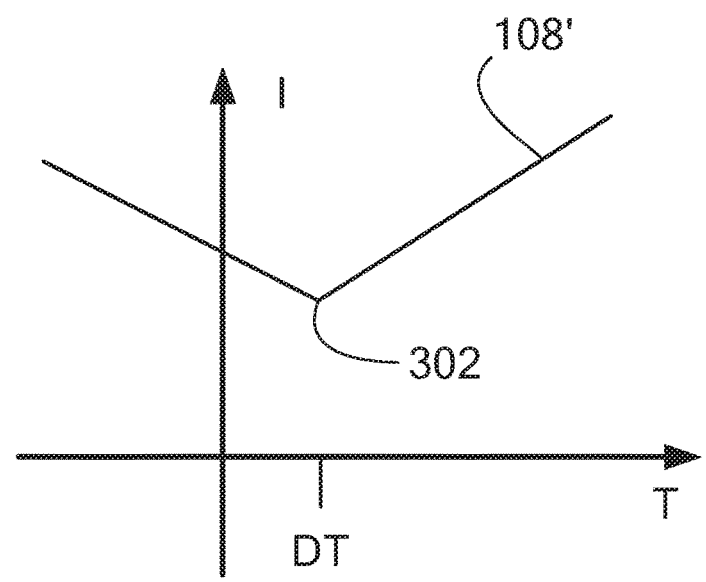
FIG. 3B is a graph of an example of a current over temperature where the minimum is at the DT.

FIG. 3A depicts one example of an Drive current 108 formed from combining the currents 102, 104, 106. The Drive current 108 does not have a minimum characteristic at DT. Referring to FIG. 3B, by weighting the Drive current 108, a current 108' is formed have a minimum value 302 (in this example, a minimum current) at DT.

Figure 4A:
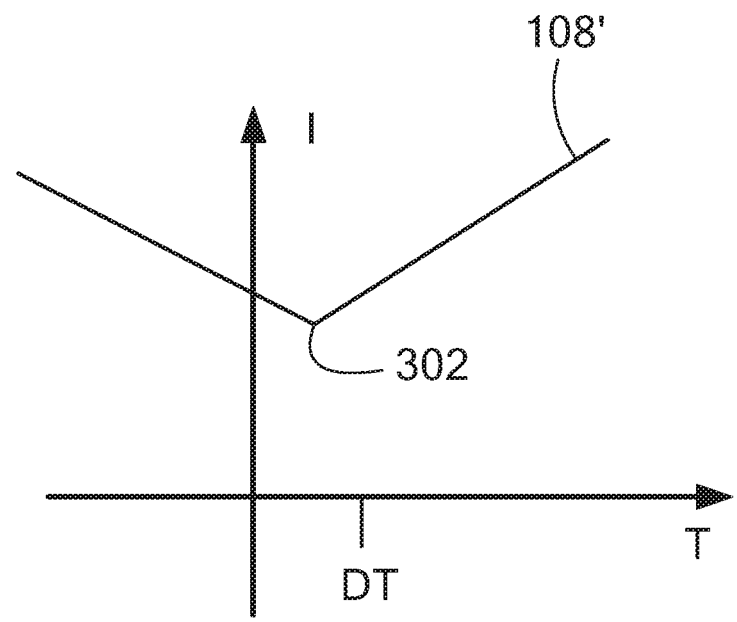
FIG. 4A is a graph of an example of a current over temperature where the minimum is below the DT.
Figure 4B:
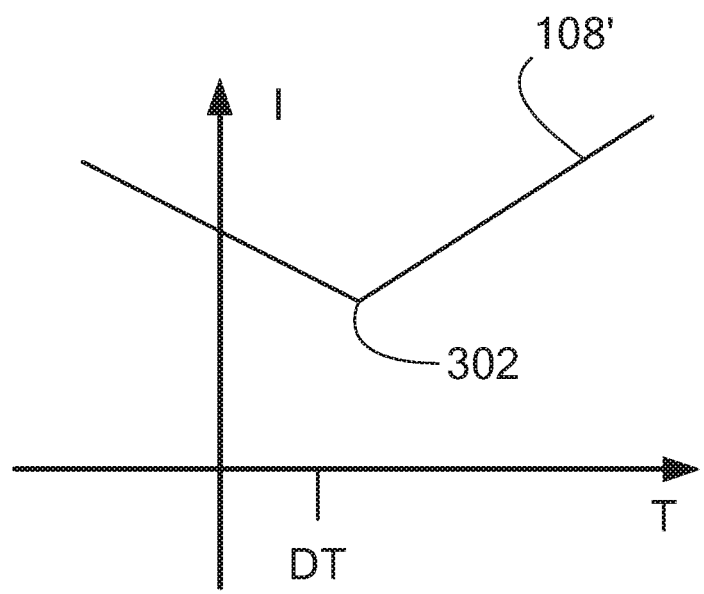
FIG. 4B is a graph of an example of a current over temperature where the minimum is above the DT.

Referring to FIGS. 4A and 4B, in some examples, after manufacturing an IC, the minimum value 302 is not at the desired temperature (DT). In one particular example, the minimum value 302 is below DT (FIG. 4A). In another particular example, the minimum value 302 is above DT (FIG. 4B).

Figure 5:
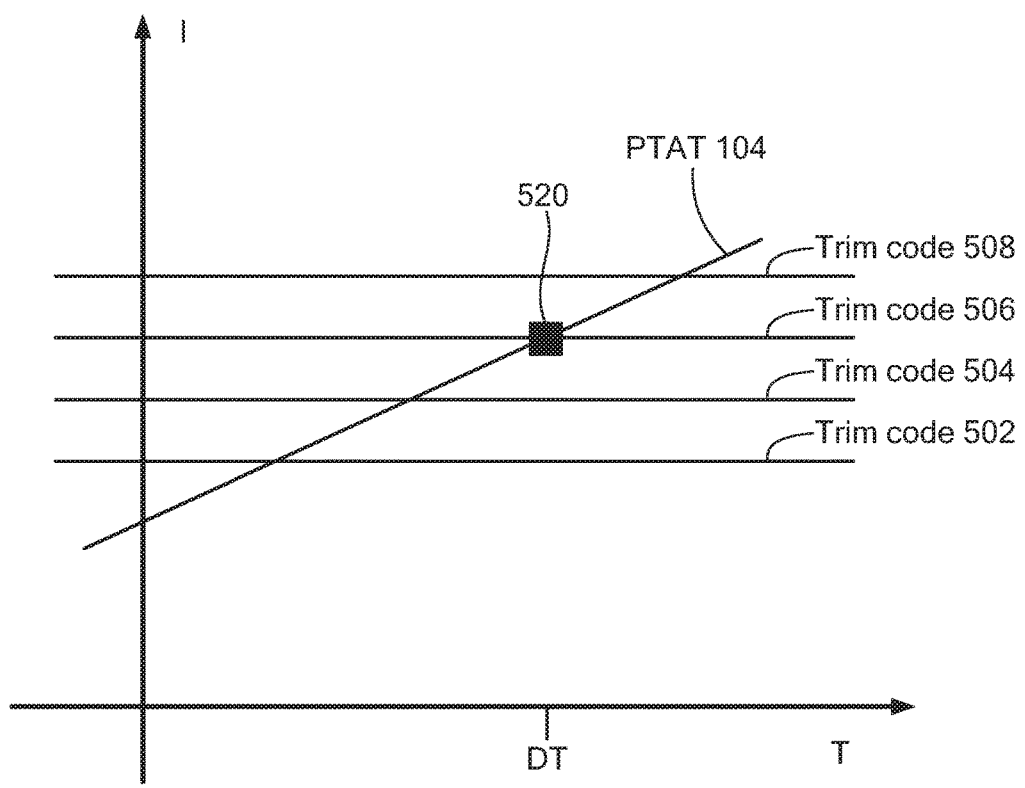
FIG. 5 is graph depicting examples of trim codes to trim the minimum value of current to occur at DT.

Referring to FIG. 5, one of a plurality trim codes (e.g., a trim code 502, a trim code 504, a trim code 506 and trim code 508) may be selected to trim the flat current 102, for example, so that the minimum value 302 occurs at DT. In this example, the trim codes correspond to flat currents. In this example, the trim code 506 is selected, which enables the flat current to be equal to the PTAT current 104 at a point 520. In one particular example, 5 bits may be used for trim, so that there are $2^5$ or 32 trim codes. In one particular example, the nominal target current is 2 uA so that each trim bit is of equal value, on the order of 25 nA. In some example, the resolution of the trim is determined by the tolerance of the DT temperature. For example, a tighter tolerance would mean more bits, and/or a smaller step size.

In other examples, the trim codes may correspond to PTAT currents instead of flat currents. For example, a PTAT current from a plurality of PTAT currents is selected that equals the flat current.

Figure 6:
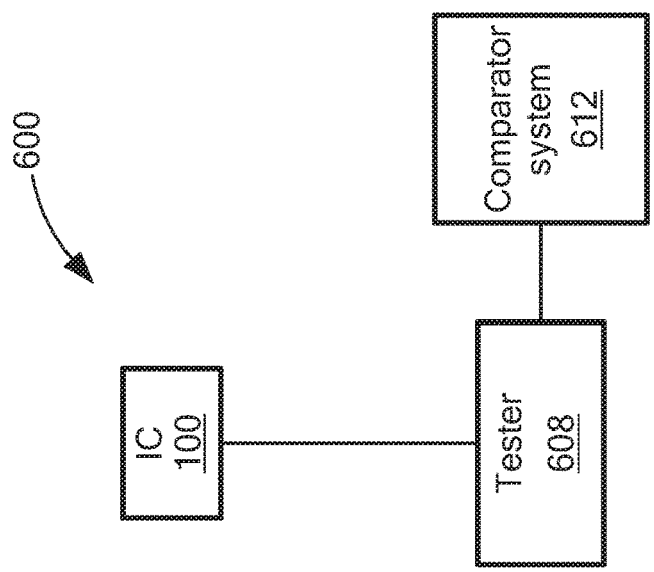
FIG. 6 is a block diagram of an example of a system to enable testing of an IC at a single temperature.

Referring to FIG. 6, in one example, a system 600 includes the IC 100, a tester 608 and a comparator system 612. The system 600 enables testing of the IC 100 at a single temperature. The comparator system 612 may be used to ensure that the minimum value 302 occurs at DT. In one particular example, the comparator system 612 takes the difference between the PTAT current and the flat current at DT and if the difference between the two values changes sign (e.g., from a positive difference to a negative difference or from a negative difference to a positive difference), then the point when the flat current equals the PTAT current is identified. The comparator system 612 notifies the tester 608 which trims code to use. In one particular example, the comparator system 612 includes a comparator.

Figure 7:
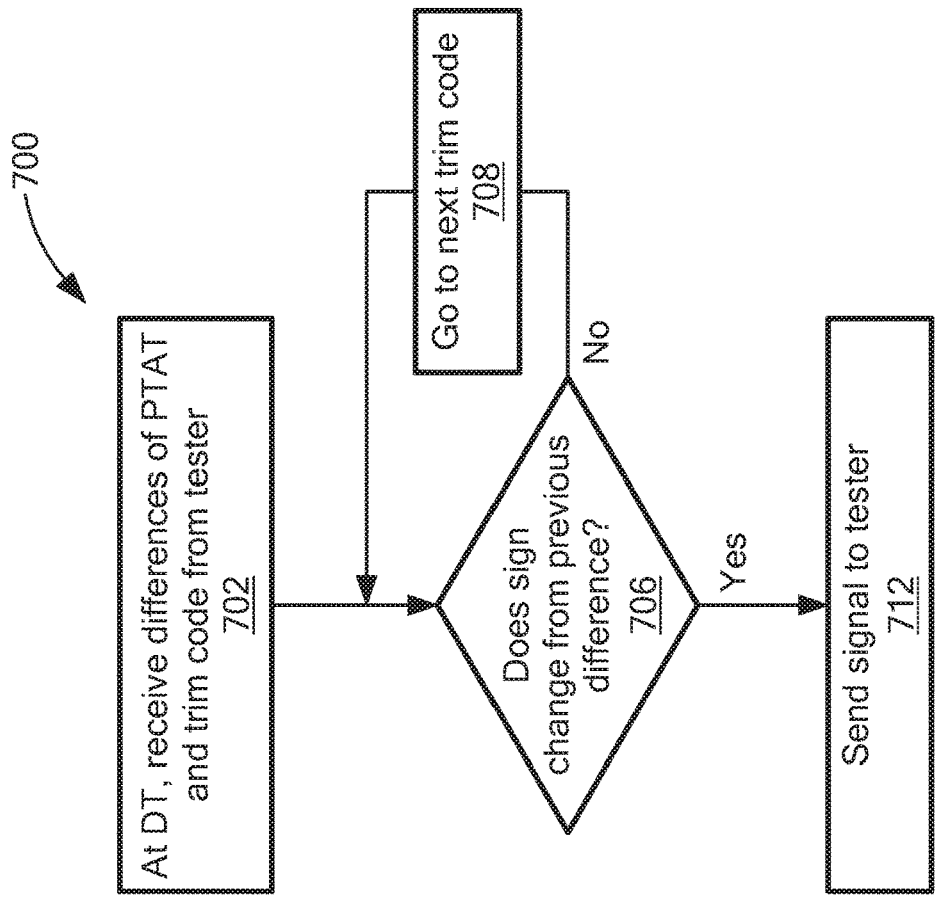
FIG. 7 is a flowchart of an example of a process to enable testing of an IC at a single temperature.

Referring to FIG. 7, a process 700 is an example of a process to enable testing of an IC at a single temperature. At DT process 700 receives the difference between the PTAT current and the flat current (702). For example, the trim code 502 is used to measure the difference first, the trim code 504 is used second to measure the difference and so forth.

Process 700 determines if the sign of the differences between PTAT and the trim code changes (706). If the sign of the difference does not change, process 700 goes to the next trim code (708). For example, the sign difference between the PTAT current and the trim code 504 at DT does not change from the sign difference between the PTAT current and the trim code 502 (i.e., they are both positive differences since PTAT current is larger than the trim codes 502, 504 at DT); and process 700 goes to the next trim code 506.

If the sign does change, process 700 sends a signal to the tester (712). For example, if the trim codes 502, 504 are evaluated before the trim code 506, the difference between the PTAT current and the trim code 506 changes from a positive sign to zero and the comparator circuit 612 signals the tester 608 to use the trim code 506. In other examples, the latest trim code evaluated could change the sign of the difference between PTAT and the trim code from a positive value to a negative value and the comparator circuit 612 signals the tester 608 to use the latest trim code. While the example herein, using FIG. 5 as an example, determines when the difference between PTAT and the trim code changes from a positive value to a negative value or zero value, process 700 may be used to determine when the difference between PTAT and the trim code changes from a negative value to a positive value or zero value.

Figure 8:
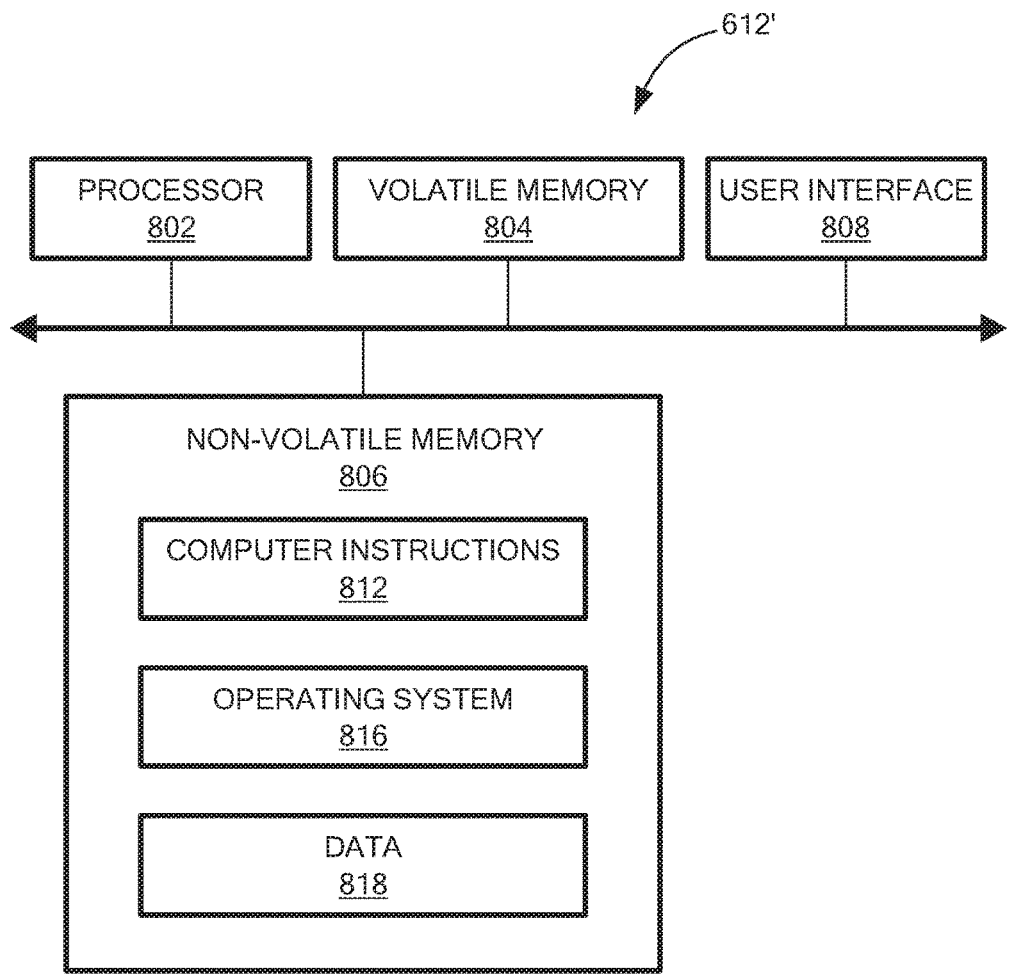
FIG. 8 is a computer on which any portion of the process of FIG. 7 may be implemented.

Referring to FIG. 8, in one example, the comparator system 612 may be a comparator system 612'. The comparator system 612' may include a processor 802, a volatile memory 804, a non-volatile memory 806 (e.g., hard disk, flash memory) and the user interface (UI) 808 (e.g., a graphical user interface, a mouse, a keyboard, a display, touch screen and so forth). The non-volatile memory 806 may store computer instructions 812, an operating system 816 and data 818. In one example, the computer instructions 812 may be executed by the processor 802 out of volatile memory 804 to perform at least a portion of the processes described herein (e.g., process 700).

The processes described herein (e.g., process 700) are not limited to use with the hardware and software of FIG. 8; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the process 700 is not limited to the specific processing order of FIG. 7. Rather, any of the processing blocks of FIG. 7 may be re-ordered, combined or removed, performed in parallel or in serial, as necessary, to achieve the results set forth above.

The processing blocks (for example, in the process 700) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit (IC), comprising:
   an output port enabling measurement of a performance characteristic of the IC at a first temperature;
   a first digital-to-analog converter (DAC) configured to receive a first current that is independent of temperature;
   a second DAC configured to receive a second current proportional to temperature;
   a third DAC configured to receive a third current that increases in magnitude above the first temperature and is zero below the first temperature;
   a fourth DAC to receive the output of the first, second and third DACs to produce an output current,
   wherein the output current is weighted to enable the output current to have the minimum value at the first temperature,
   wherein the performance characteristic of the IC is a minimum value at the first temperature with respect to any other temperature.

2. The IC of claim 1, wherein the first temperature is room temperature.

3. The IC of claim 1, wherein the performance characteristic is controlled by current.

4. The IC of claim 1, wherein the first current equals the second current at the first temperature.

5. The IC of claim 1, wherein the first current is trimmed based on performance of the IC at the first temperature to enable the output current to have a minimum at the first temperature.

6. The IC of claim 5, wherein a signal is received to trim the first current in response to the first current and the second current at the first temperature.

7. The IC of claim 6, wherein the signal is received from a comparator system configured to measure the difference between the first and second currents.

8. The IC of claim 7, wherein the signal indicates the first and second currents are equal at the first temperature.

9. The IC of claim 1, where the second current is trimmed based on performance of the IC at the first temperature to enable the output current to have a minimum at the first temperature.

10. The IC of claim 9, wherein a signal is received to trim the second current in response to the first current and the second current at the first temperature.

11. The IC of claim 1, wherein the performance characteristic is controlled by voltage.

12. The IC of claim 1, wherein the performance characteristic is controlled a magnetic field.

13. An integrated circuit (IC), comprising:
    a first digital-to-analog converter (DAC) configured to receive a first current that is independent of temperature;
    a second DAC configured to receive a second current proportional to temperature;
    a third DAC configured to receive a third current that increases in magnitude above room temperature and is zero below the room temperature;
    a fourth DAC to receive the output of the first, second and third DACs to produce an output current,
    an output port enabling measurement of a performance characteristic of the IC at the room temperature,
    wherein the performance characteristic of the IC is a minimum value at the room temperature with respect to any other temperature,
    wherein the performance characteristic is controlled by at least one of current, voltage or a magnetic field,
    wherein the output current is weighted to enable the output current to have the minimum value at the first temperature.

14. The IC of claim 13, wherein the signal indicates the first and second currents are equal at the room temperature.

15. The IC of claim 13, wherein a signal is received to trim the first current in response to the first current and the second current at the room temperature.

16. The IC of claim 13, wherein the first current is trimmed based on performance of the IC at the first temperature to enable the output current to have a minimum at the first temperature,
    wherein a signal is received to trim the first current in response to the first current and the second current at the first temperature,
    wherein the signal is received from a comparator system configured to measure the difference between the first and second currents,
    wherein the signal indicates the first and second currents are equal at the first temperature.

17. The IC of claim 13, where the second current is trimmed based on performance of the IC at the first temperature to enable the output current to have a minimum at the first temperature,
    wherein a signal is received to trim the second current in response to the first current and the second current at the first temperature,
    wherein the signal is received from a comparator system configured to measure the difference between the first and second currents.

* * * * *

UNITED STATES PATENT AND TRADEMARK OFFICE
CERTIFICATE OF CORRECTION

PATENT NO. : 10,120,017 B2
APPLICATION NO. : 15/211022
DATED : November 6, 2018
INVENTOR(S) : Kristann L. Moody et al.

Page 1 of 1

It is certified that error appears in the above-identified patent and that said Letters Patent is hereby corrected as shown below:

Column 2, Line 20 delete "a digital-to-analog converters" and replace with --digital-to-analog converters--.

Column 2, Line 49 delete "an Drive current" and replace with --an IDrive current--.

Column 2, Line 52 delete "the Drive current" and replace with --the IDrive current--.

Column 2, Line 53 delete "is formed have a minimum" and replace with --is formed having a minimum--.

Column 3, Line 4 delete "In some example," and replace with --In some examples,--.

Column 3, Line 27-28 delete "At DT process" and replace with --Process--.

Column 6, Line 4 delete "controlled a magnetic field" and replace with --controlled by a magnetic field--.

Signed and Sealed this
Eleventh Day of December, 2018

Andrei Iancu
*Director of the United States Patent and Trademark Office*